United States Patent
Malone et al.

(10) Patent No.: US 7,342,786 B2
(45) Date of Patent: Mar. 11, 2008

(54) AIR DUCT WITH AIRTIGHT SEAL

(75) Inventors: Christopher G. Malone, Loomis, CA (US); Glenn C. Simon, Auburn, CA (US); Bryan Bolich, Davis, CA (US); Victoria Tsang Tam, Davis, CA (US)

(73) Assignee: Hewlett-Packard Development Company, L.P., Houston, TX (US)

(*) Notice: Subject to any disclaimer, the term of this patent is extended or adjusted under 35 U.S.C. 154(b) by 205 days.

(21) Appl. No.: 11/258,849

(22) Filed: Oct. 25, 2005

(65) Prior Publication Data

US 2007/0091564 A1   Apr. 26, 2007

(51) Int. Cl.
*H05K 7/20* (2006.01)

(52) U.S. Cl. .............. 361/695; 361/690; 361/697; 361/719; 174/16.1; 174/16.3; 165/80.3; 165/104.33

(58) Field of Classification Search .............. None
See application file for complete search history.

(56) References Cited

U.S. PATENT DOCUMENTS

| | | | |
|---|---|---|---|
| 5,467,250 A * | 11/1995 | Howard et al. .............. 361/696 |
| 5,630,469 A * | 5/1997 | Butterbaugh et al. ...... 165/80.3 |
| 5,691,883 A | 11/1997 | Nelson |
| 5,910,884 A * | 6/1999 | Garza et al. ................. 361/690 |
| 5,917,698 A * | 6/1999 | Viallet ......................... 361/695 |
| 5,982,616 A | 11/1999 | Moore |
| 6,038,128 A | 3/2000 | Hood, III et al. |
| 6,058,009 A | 5/2000 | Hood, III et al. |
| 6,064,571 A | 5/2000 | Noble |
| 6,130,819 A | 10/2000 | Lofland et al. |
| 6,288,895 B1 | 9/2001 | Bhatia |
| 6,330,154 B1 | 12/2001 | Fryers et al. |
| 6,452,797 B1 | 9/2002 | Konstad |
| 6,459,576 B1 | 10/2002 | Bhatia et al. |
| 6,462,948 B1 | 10/2002 | Leija et al. |
| 6,552,898 B1 | 4/2003 | Noble |
| 6,570,776 B2 * | 5/2003 | MacDonald et al. ......... 361/818 |
| 6,678,157 B1 * | 1/2004 | Bestwick ..................... 361/695 |
| 6,721,180 B2 * | 4/2004 | Le et al. ..................... 361/695 |
| 6,778,390 B2 | 8/2004 | Michael |
| 6,781,834 B2 * | 8/2004 | Nair et al. ................... 361/697 |
| 7,061,761 B2 * | 6/2006 | Tucker et al. ............... 361/695 |
| 2003/0155106 A1 | 8/2003 | Malone et al. |
| 2006/0120039 A1 * | 6/2006 | Yuval .......................... 361/694 |
| 2006/0221591 A1 * | 10/2006 | Kong .......................... 361/818 |

* cited by examiner

*Primary Examiner*—Boris Chérvinsky (57) ABSTRACT

A cooling apparatus comprises a printed circuit board and an air duct positioned adjacent the printed circuit board spanning space and forming an air-guiding channel from at least one system fan to at least one heat sink. The air-guiding channel is bounded on one side by the printed circuit board and on remaining sides by the air duct that compresses against the printed circuit board in a substantially airtight seal.

19 Claims, 9 Drawing Sheets

AIR DUCT WITH AIRTIGHT SEAL

BACKGROUND OF THE INVENTION

The difficulty of cooling high power electronic systems such as server or microprocessor systems has grown in recent years as a result of demand for vastly more powerful processors combined with a similarly strong demand for smaller system form factors. Thus, introduction of faster, higher performance semiconductors coincides with a concomitant increase in heat concentration problems. The generated thermal energy is intense with semiconductor chips that dissipate more than 100 watts of power.

Various structures and techniques may be used to attain suitable thermal engineering. Heat is generated by microelectronic chips and is removed to the surrounding air stream. Flowing heat is countered by thermal resistance impeding heat removal. Semiconductor and integrated circuit performance and reliability are absolutely constrained by temperature. Failure rate increases exponentially with rise in junction temperature with a myriad of device temperature-related failure modes including aspects of thermal runaway, gate dielectric strength, electro-migration diffusion, junction fatigue, electrical parameter shifts, and others, any of which may result in semiconductor failure.

Thermal engineering approaches typically involve supply of ventilation of ambient air around processing units including supply of simple ventilation holes or slots and installation of motorized fans in processing system cabinets. Other thermal engineering approaches include usage of fan-type assemblies mounted on or near heat-dissipating electronic components and devices. These techniques commonly realize only nominal benefit often with a disproportionate increase in system cost and complexity.

SUMMARY

In accordance with an embodiment of an electronic device, a cooling apparatus comprises a printed circuit board and an air duct positioned adjacent the printed circuit board spanning space and forming an air-guiding channel from at least one system fan to at least one heat sink. The air-guiding channel is bounded on one side by the printed circuit board and on remaining sides by the air duct that compresses against the printed circuit board in a substantially airtight seal.

BRIEF DESCRIPTION OF THE DRAWINGS

Embodiments of the invention relating to both structure and method of operation may best be understood by referring to the following description and accompanying drawings.

DETAILED DESCRIPTION

High-power processors create a demand for extremely efficient cooling devices, particularly in systems contained within constraints of dense form factors. A cooling apparatus includes an air duct with little air leakage to direct high-pressure air from system fans through processor heat sinks. In an illustrative embodiment, heat sinks may have a very high fin count in a compact geometry so the pressure drop across the heat sink is significant. As a result, small leaks in the air duct result in diversion of cooling air and poor thermal performance.

An air duct is disclosed that is low in cost, easily removable, and effective for minimizing or reducing leaks.

Figure 1A:
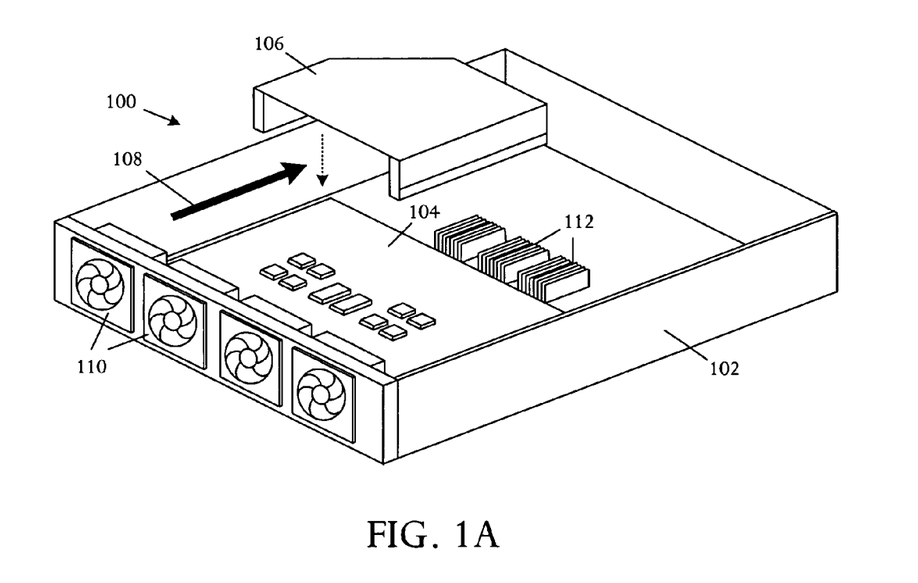
FIGS. 1A and 1B are perspective pictorial diagrams including respective exploded and attached views showing an embodiment of a cooling apparatus forming an airtight duct.
Figure 1B:
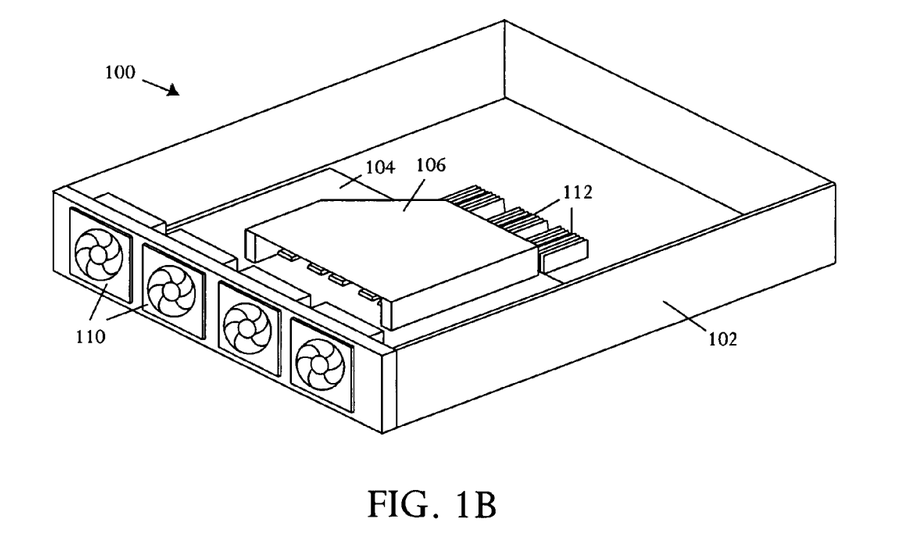

Referring to FIGS. 1A and 1B, perspective pictorial diagrams illustrate respective exploded and attached views showing an embodiment of a cooling apparatus 100 configured for usage in an electronic device 102. The cooling apparatus 100 comprises a printed circuit board 104 and an air duct 106 positioned adjacent the printed circuit board 104. The air duct 106 spans the space and forms an air-guiding channel 108 from one or more system fans 110 to one or more heat sinks 112. The air-guiding channel 108 is bounded on one side by the printed circuit board 104 and on remaining sides by the air duct 106 that compresses against the printed circuit board 104 in a substantially airtight seal.

In the illustrative embodiment, the cooling apparatus 100 has a c-shaped duct 106, for example constructed from sheet metal, plastic or other materials such as printed circuit board stock, with conformal foam on vertical duct walls which make contact with a server printed circuit board 104. The duct 106 is placed on the circuit board 104, bridging the space between the system fans 110 and the processor heat sinks 112. In an illustrative embodiment, a top cover is added to a housing holding the electronic device 102, compressing the duct 106 and the conformal foam against the printed circuit board 104, creating a near-perfectly air-sealed duct. The design is lightweight, may be sufficiently secured without using hardware fasteners, and may easily be removed from the system. In contrast, conventional ducting structures for servers have traditionally required elaborate and expensive plastic parts with fasteners, designs which are inflexible to changes in system designs and involve many months of development time prior to deployment.

Figure 2A:
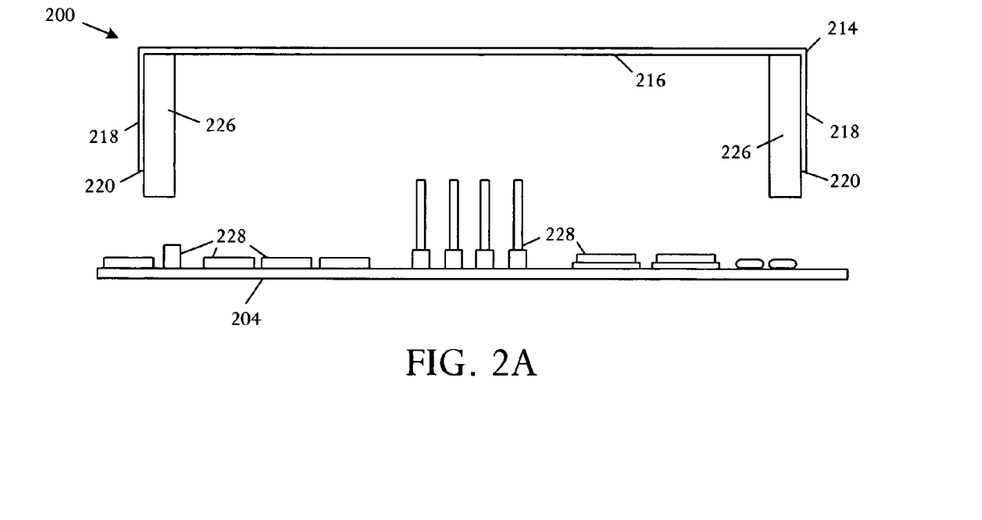
FIGS. 2A, 2B, and 2C are multiple views depicting respective exploded frontal cross-section, attached frontal cross-section, and perspective representations illustrating an embodiment of a cooling apparatus using conformal foam to form an airtight duct.
Figure 2B:
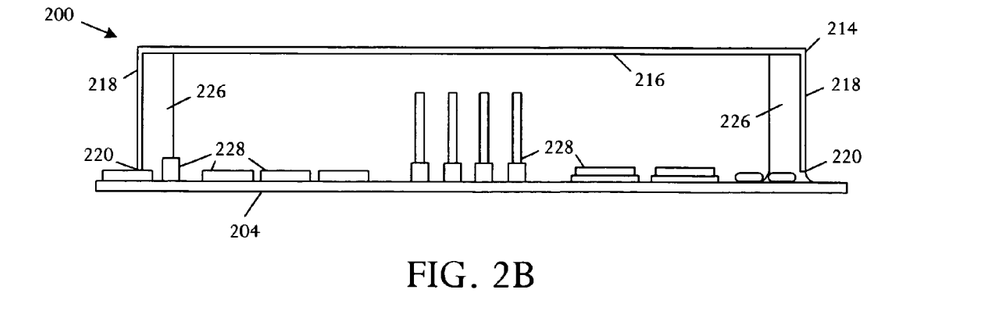
Figure 2C:
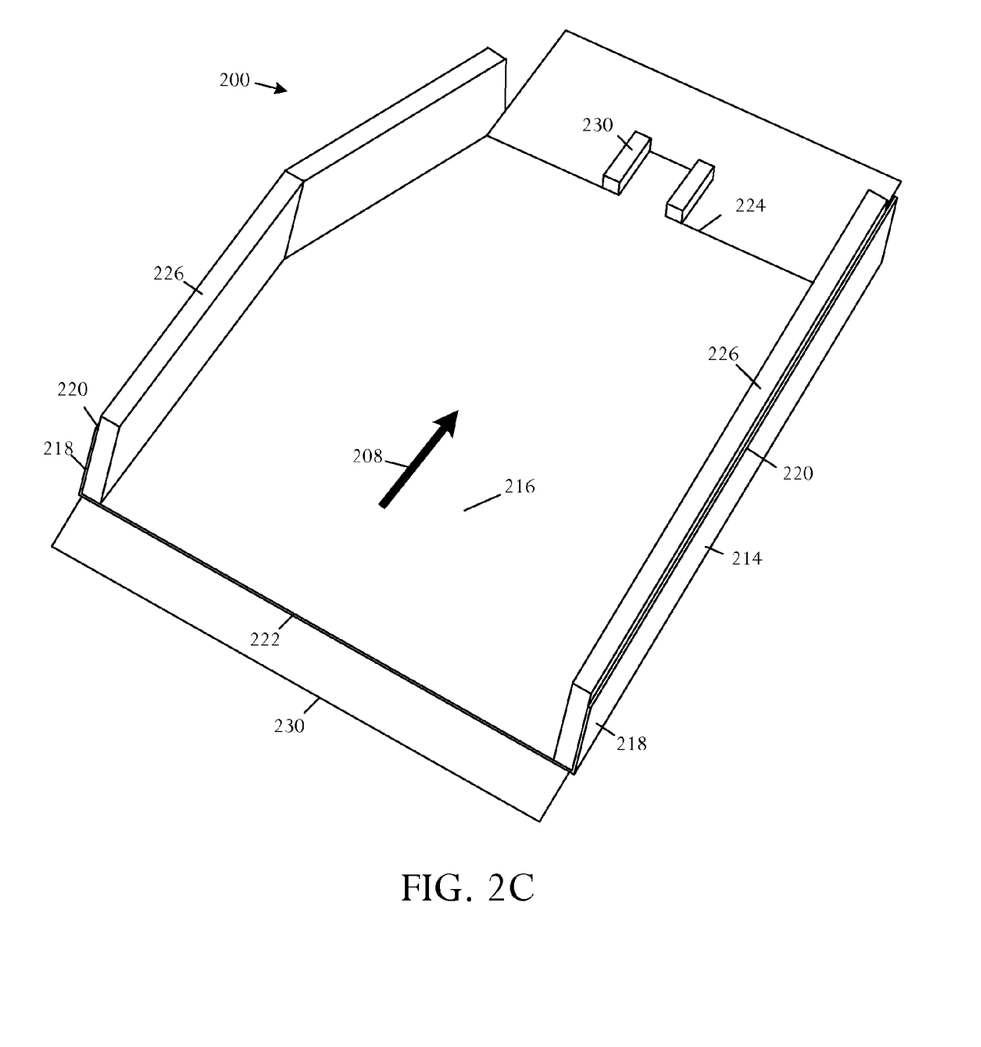

Referring to FIGS. 2A, 2B, and 2C, multiple views respectively depict an exploded frontal cross-section, an attached frontal cross-section, and a perspective representation illustrating an embodiment of a cooling apparatus 200 adapted to cool an electronic system using a fan. The cooling apparatus 200 comprises a rigid panel 214 configured with a frontal view in the form of a cross-section including a raised interior portion 216 and lateral sides 218 that terminate in lines 220 intersecting a common plane. The raised interior portion 216 forms an air-guiding channel 208 adapted to receive air from an input opening 222 at an input end of the rigid panel 214 and guide the air to an output opening 224 at an output end of the panel 214 opposing the input end. The cooling apparatus 200 further comprises an airtight conformal foam 226 attached to the rigid panel lateral sides 218 that extend beyond the terminating lines 220 of the rigid panel 214 in a configuration such that the rigid panel 214 and the conformal foam 226 are adapted for compression against a printed circuit board 204. The rigid panel 214, the printed circuit board 204, and the foam 226 form an airtight enclosure 206 containing the air-guiding channel 208.

Foam strips 226 are depicted on sides of duct 206 on sides parallel to the airflow channel 208. Foam may also be added to extend along the top, front, and back edges of the duct 206 to avoid air leakage.

The airtight conformal foam 226 is adapted to precisely seal the rigid panel 214 to protuberances, gaps, ridges, and crenellations formed by components, devices and/or elements 228 mounted on the printed circuit board 204.

The foam 226 may be positioned directly overlying some components. The duct 206 is compressed, for example by applying a housing cover to the housing, compressing the foam 226 against overlaid components and thereby embedding the components into the foam 226. Foam 226 around the component pushes down and contacts the printed circuit board surface, creating a seal that avoid air leakage.

The airtight conformal foam 226 typically is constructed from a material selected for compliance, density, non-conductivity, non-porosity, and non-flammability according to the particular application characteristics. The foam material may be selected for appropriate conductivity properties to avoid short-circuiting of components on the circuit board and/or to control or contain electromagnetic emissions. The foam is generally selected for a level of compliance or density according to particular application or usage, for example depending on electrical and structural characteristics of components mounted on the board. Fundamentally, the foam is selected to have compliance suitable to conform the duct panel to the variations in height of mounted components. The foam porosity or density is selected to prevent air bypass so that the selected foam does not generally have open-cell character that would allow leakage of air.

In some embodiments, the foam is selected for reduced flammability to retard possibility of flame or fire and to avoid smoke generation at high temperatures. Foam selection for inflammability is generally application dependent. For example, usage in a data center environment may be associated with more stringent operating criteria.

For example in some embodiments the airtight conformal foam 226 may be selected with sufficient resilience and the rigid panel 214 configured to compress against the printed circuit board 204 by fastening a cover to a housing containing the apparatus so that the rigid panel 214 is secured in place against the printed circuit board 204 without using hardware fasteners.

In a typical embodiment, the cooling apparatus 200 may be used to cool an electronic device such as a server or a server enclosed within a 1U or 2U housing. The cover may be a typical 1U or 2U system cover whereby closing of the cover compresses the conformal foam 226, forms the airtight seal, and restrains the duct 206 against motion or translation relative to the printed circuit board 204.

In some embodiments, the cooling apparatus 200 may further comprise one or more seals 230 coupled to either or both the input end and the output end of the rigid panel 214.

In some arrangements, the seals 230 are formed in a configuration that is conformal to structures abutting the rigid panel 214, enabling formation of an airtight seal with the abutting structures.

Typically, the seals 230 are structured as a conformal piece on edges of the duct 206 used to further extend the duct 206 and further reduce air leakage. The seals 230 may be constructed from a foam material or may be constructed from any suitably rigid material. A seal 230 constructed from rigid material may have attached foam to avoid leakage. For example, foam may be applied at inlet and outlet ends of the duct 206 to block various orifices and apertures. The seals 230 are generally configured to conform to items abutting the duct 206 such as fans and heat sinks.

In various embodiments and implementations, the rigid panel 214 may be constructed from a selected material such as metal, sheet metal, and plastic. The technique of using conformal foam to create an airtight duct enables innovative usage of other materials to perform multiple functions.

As the duct 206 is compressed against the printed circuit board 204, the shape of the foam 226 conforms to the cross-sectional profile or "skyline" of components mounted on the printed circuit board 204. The components typically have varying heights, shapes and sizes. A conventional plastic or metal air duct typically does not make an airtight seal against a printed circuit board at least partly due to obstruction from components mounted on the board. In the illustrative configuration, resilient foam 226 conforms to the shape of gaps between components and structures on the printed circuit board 204 and forms a perfect or nearly perfect airtight seal. The resilient foam 226 is typically a section of sponge, foam, foam rubber, or the like which compresses against the printed circuit board 204, regardless of the profile of components on the board, to fill the gaps and cracks around the components, creating a substantially airtight seal. The airtight seal effectively directs airflow to the component being cooled, for example a central processing unit or other heat-generating component. The illustrative cooling apparatus 200 facilitates and improves cooling of any suitable heat-generating component that operates more effectively with receipt of directed air.

Usage of conformal foam 226 that is electrically non-conductive enables safe operation and avoidance of short-circuiting.

The illustrative air duct 206 with conformal foam 226 may also enable improvements in cost savings, design and fabrication time, and efficiency since the shape of rigid duct portions does not have to include cut-outs, apertures, and gaps to accommodate components on the printed circuit board. A design cycle for conventional boards which include such cut-outs may take weeks or months for proper fabrication. Similarly, rigid portions of conventional ducts may not accommodate changes to the design of a printed circuit board and/or size and shape variations of components mounted on the printed circuit board. The illustrative air duct 206 with conformal foam 226 is adaptable and may accommodate changes in circuit board topology, enabling the use of the same duct piece which conforms to a new topology within a range of boundary conditions or structures. The air duct 206 can be used in an adaptive manner in conditions or circumstances of a variety of printed circuit boards within a range of topologies and with components within a range of heights and shapes. A printed circuit layout designer may change the size, position, location, arrangement, and type of components on the board within a range and the air duct 206 would maintain an airtight seal around the new components due to the compliant and conformal character of the foam 226.

Figure 3A:
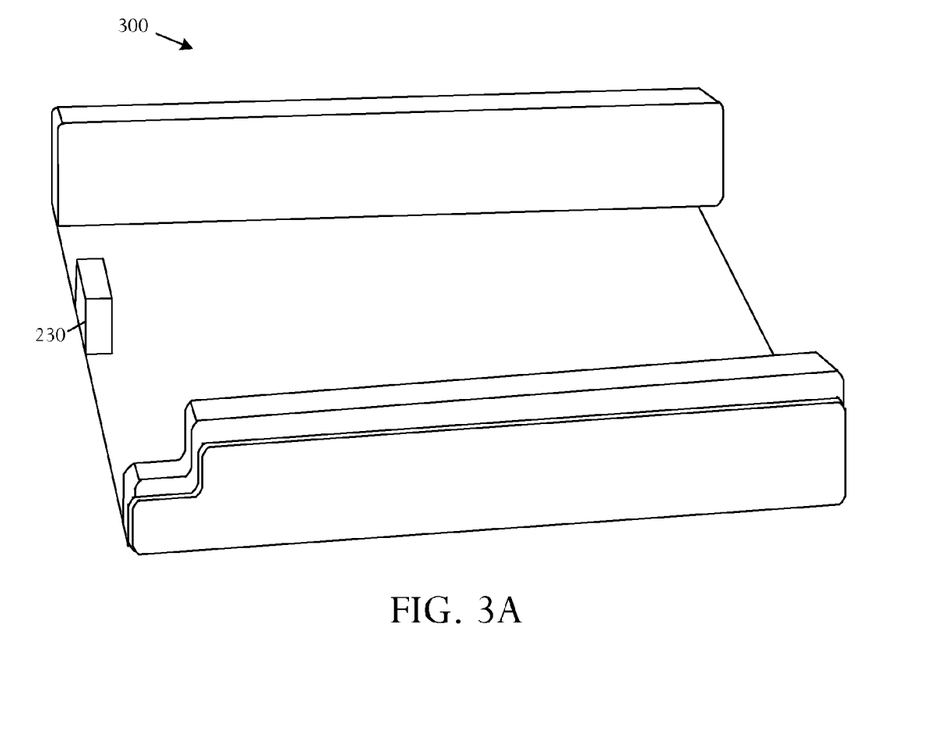
FIGS. 3A, 3B, and 3C are pictorial diagrams showing duct embodiments constructed using various types of materials.

FIG. 3A is a pictorial diagram depicting an inverted view of a rigid panel 300 constructed from metal or plastic.

Figure 3B:
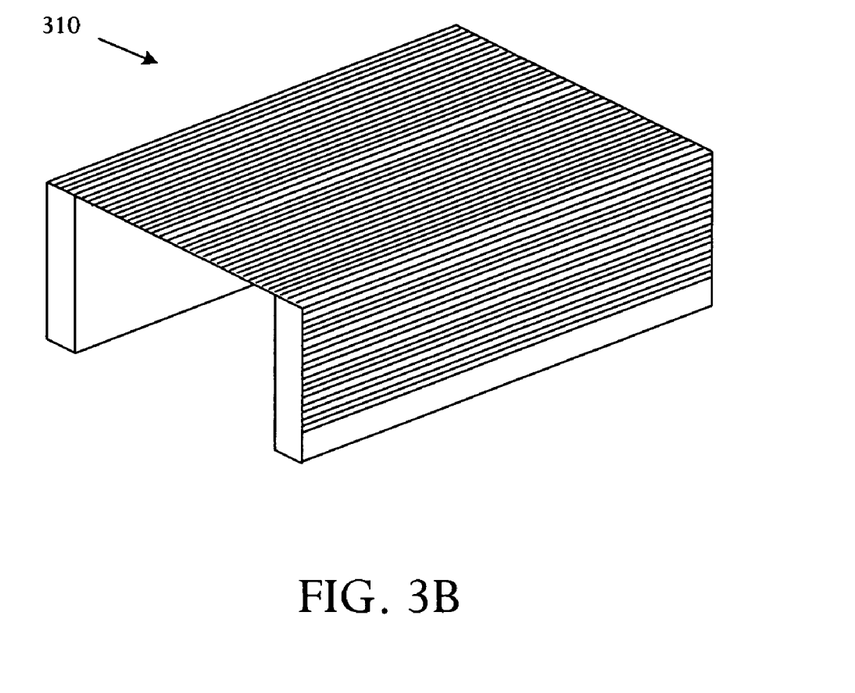

FIG. 3B is a perspective pictorial diagram showing an embodiment of an air duct 310 configured using ribbon cable or wide interconnect cable materials. Accordingly, signal cables, which typically obstruct air flow and consume some of the limited internal space of a server or other electronic system, may be used to form structural panels for the duct 300.

Figure 3C:
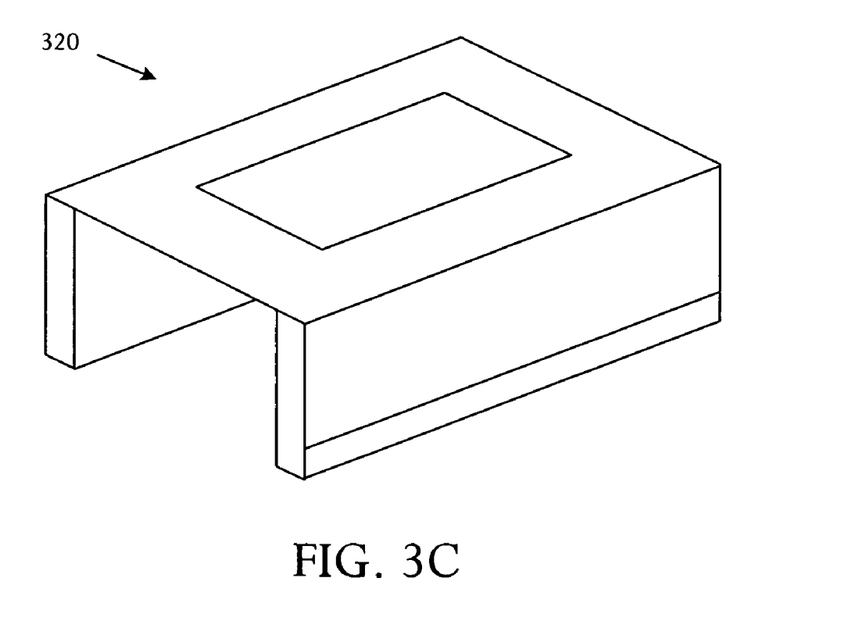

FIG. 3C is a perspective pictorial diagram illustrating an embodiment of an air duct 320 which is configured using liquid crystal display screen material to similarly perform multiple functions, thereby conserving internal space within an electronic system. The display air duct 320 may be used in combination with an electronic device having a device cover with an aperture or transparent window.

The duct may be constructed from any suitable rigid material. Other embodiments may use sheet metal, plastic, rigid label stock material, printed circuit board, sufficiently rigid cable material such as ribbon cabling, and any other suitable materials. For example, printed circuit board segments may be attached to structures inside a system for example via cabling to form a rigid structure. Compliant foam mounted onto the printed circuit board segments may be compressed against a system printed circuit board to form a suitably air-tight duct.

Figure 4:
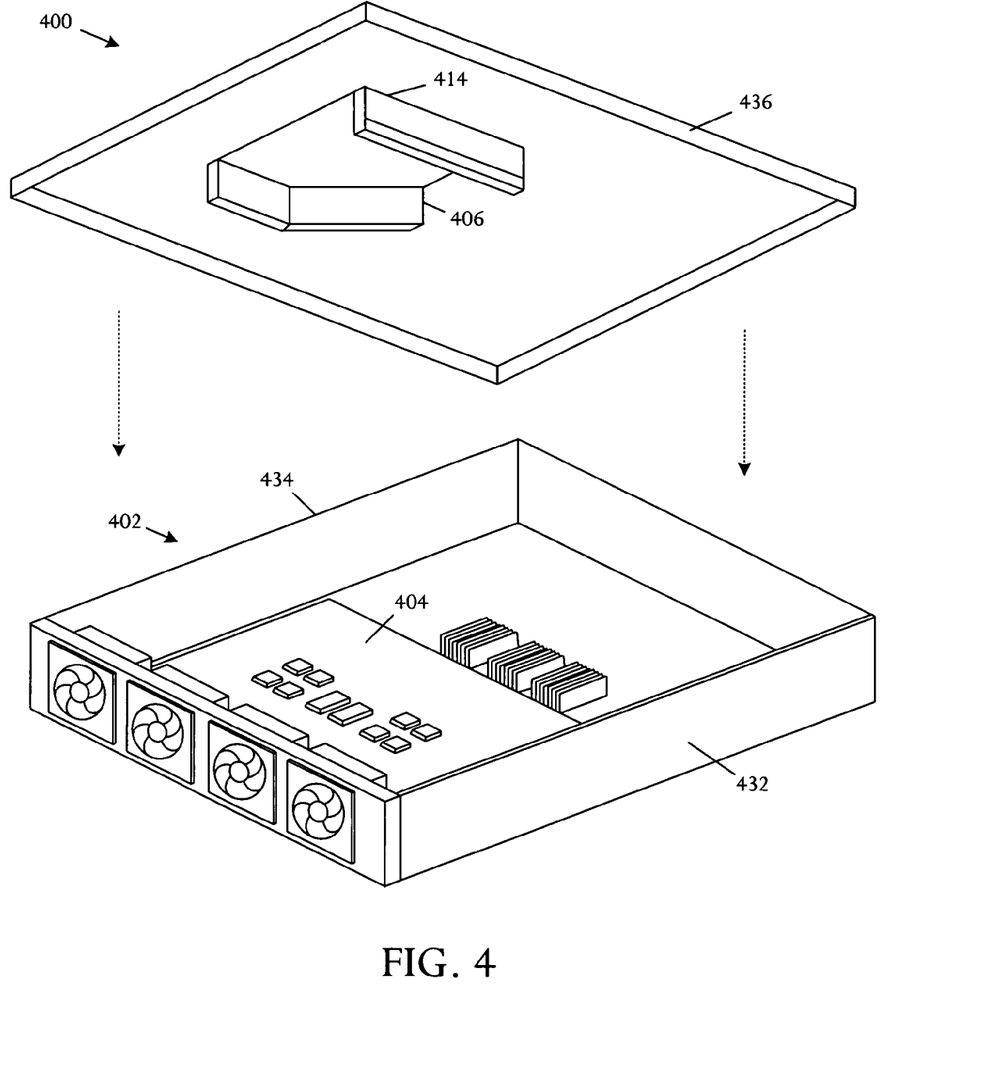
FIG. 4 is a perspective pictorial diagram illustrating an embodiment of a cooling apparatus implemented in an electronic device and formed in a configuration including a rigid panel which is integral with a housing containing the device.

Referring to FIG. 4, a perspective pictorial diagram illustrates an embodiment of a cooling apparatus 400 implemented in an electronic device 402 in a configuration including an air duct 406 contained by a rigid panel 414 which is integral with a housing 432 containing the device 402. In the illustrative embodiment, the electronic device 402 is contained within the housing 432 including a housing base 434 and a housing cover 436. The rigid panel 414 and printed circuit board 404 are also contained within the housing 432. The rigid panel 414 is shown attached to the housing cover 436 or as part of the housing cover 436.

In many arrangements, the air duct is separate from the housing cover. In a typical arrangement of an electronic device 402 with an air duct 406 integral with or fastened to the housing cover 436, the duct 406 and cover 436 are lowered vertically down onto the printed circuit board 404 and housing base 434 to avoid catching the duct 406 on structures internal to the housing 432 during lateral translation.

Figure 5A:
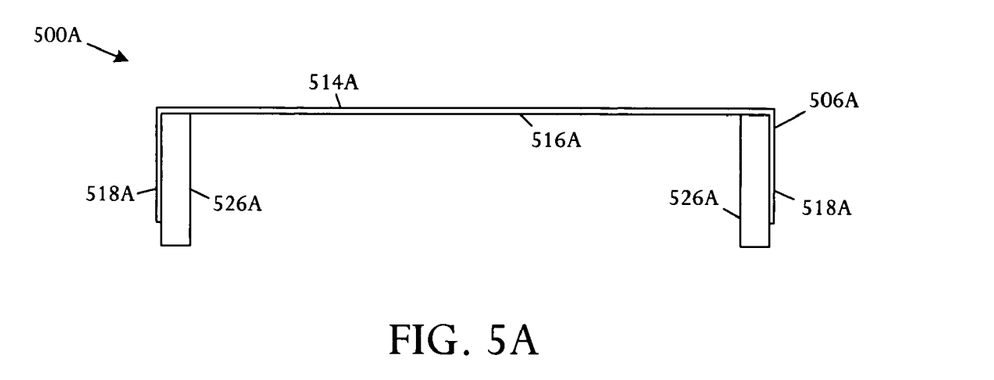
FIGS. 5A and 5B are cross sectional frontal views showing examples of various air duct embodiments with different forms and shapes.
Figure 5B:
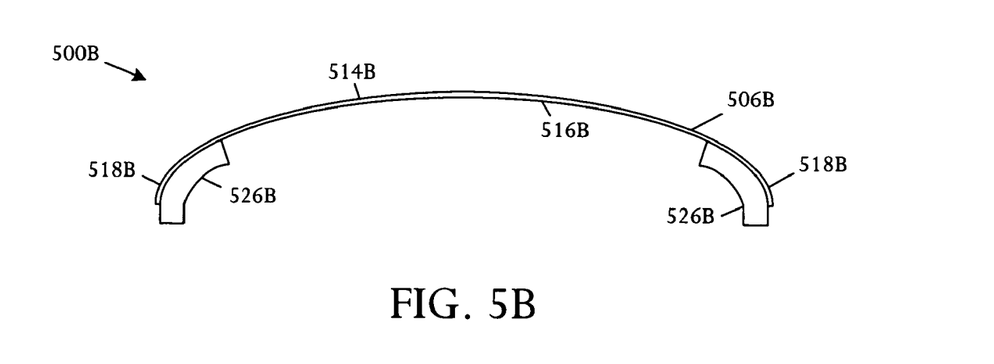

Referring to FIGS. 5A and 5B, two cross sectional frontal views show examples of various air duct embodiments with different forms and shapes. FIG. 5A illustrates a cooling apparatus 500A comprising an air duct 506A including a rigid panel 514A with a generally rectangular form with lateral sides 518A arranged perpendicular or at an angle with a planar sheet forming a raised portion 516A. Airtight foam 526A is affixed to the lateral sides 518A of the rigid panel 514A.

In many implementations, the cooling apparatus may have an angular structure constructed from planar rigid panels fastened or bent at angular junctions such as is shown in FIG. 5A. In other embodiments, the cooling apparatus may have any appropriate configuration. For example, FIG. 5B illustrates an embodiment of a cooling apparatus 500 implemented as an air duct 500B structured as a rigid panel 514B with curved walls. The curved walls form a raised interior portion 516B and curved lateral sides 518B. Airtight foam 526B is attached to the curved lateral sides 518B of the rigid panel 514B.

Figure 6A:
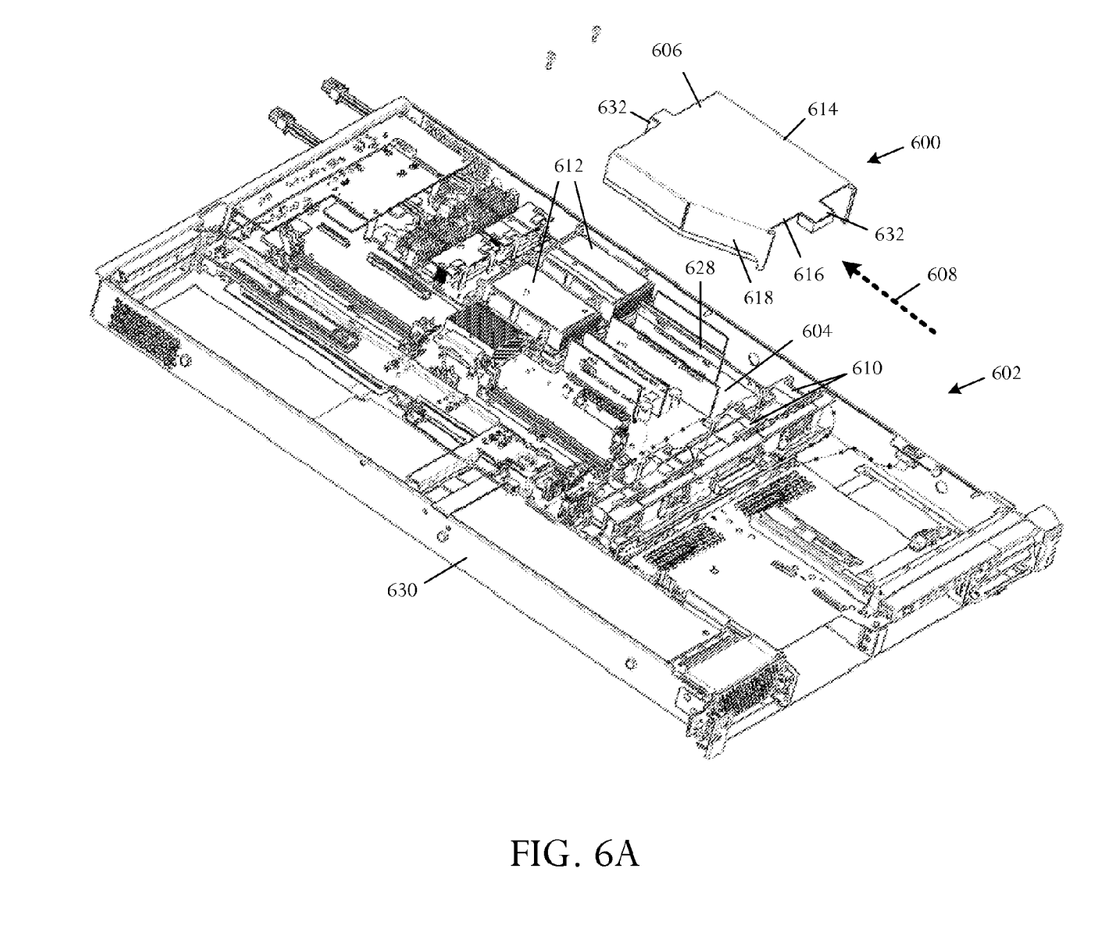
FIGS. 6A and 6B are perspective pictorial diagrams respectively depicting exploded and attached views of an electronic device that incorporates an air duct using conformal foam to form an airtight seal when compressed against a printed circuit board.
Figure 6B:
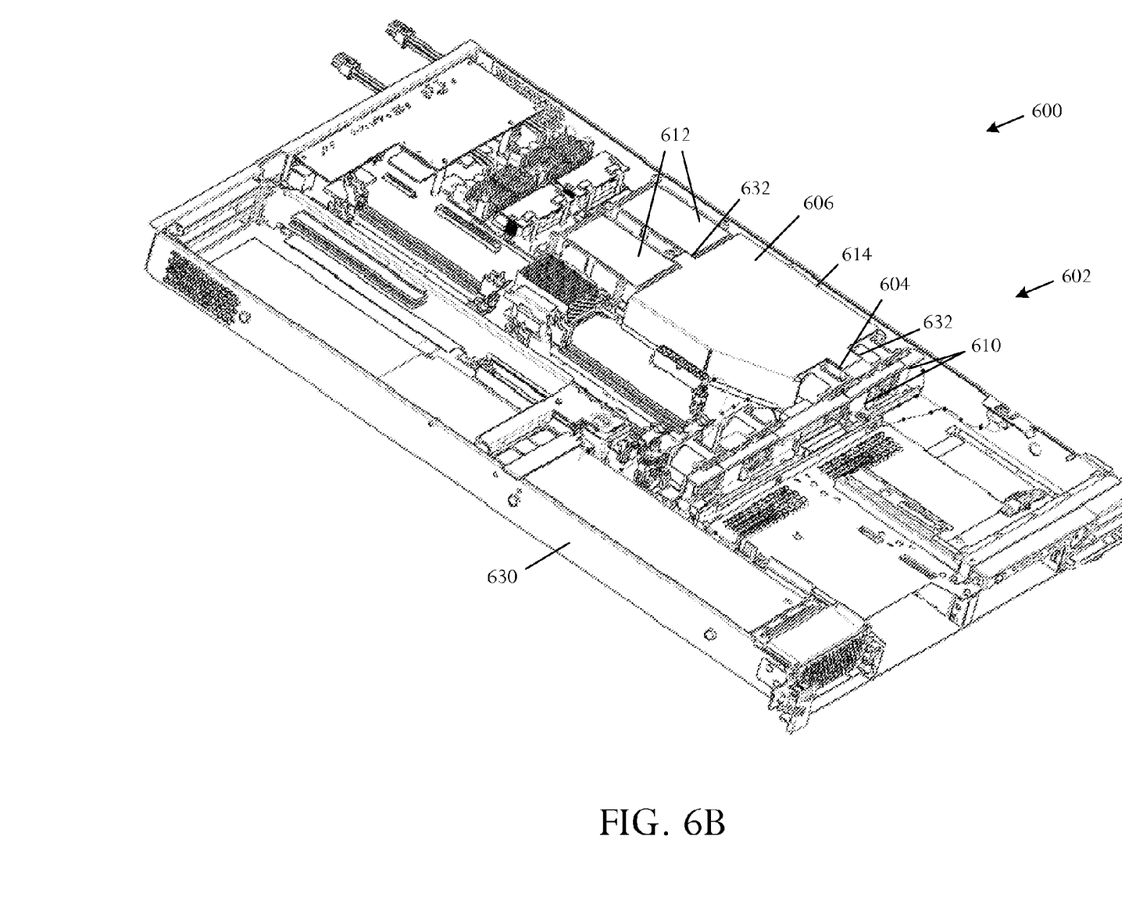

Referring to FIGS. 6A and 6B, perspective pictorial diagrams respectively depict exploded and attached views of an electronic device 602 that incorporates an air duct 606 using conformal foam to form an airtight seal when compressed against a printed circuit board 604. The electronic device 602 comprises a housing 630. The printed circuit board 604, one or more system fans 610, one or more integrated circuits, and one or more heat sinks 612 coupled to the integrated circuits are mounted in the housing 630. The electronic device 602 further comprises the air duct 606 positioned adjacent the printed circuit board 604. The air duct 606 spans the space between the system fans 610 on a first side and the heat sinks 612 on a second side, forming an air-guiding channel 608 from the fans 610 to the heat sinks 612. The air-guiding channel 608 is bounded on one side by the printed circuit board 604 and on remaining sides by the air duct 606 that compresses against the printed circuit board 604 in a substantially airtight seal on closure of the housing 630.

In an illustrative embodiment, a cooling apparatus 600 for the electronic system 602 may be constructed by forming a rigid panel 614 in a configuration with a frontal cross-sectional structure including a raised interior portion 616 and lateral sides 618 that terminate in lines intersecting a common plane. Airtight conformal foam is attached to the rigid panel lateral sides 618 and extends beyond the common plane. The rigid panel 614 and the conformal foam are compressed against the printed circuit board 604, forming an airtight enclosure containing the air-guiding channel 608 within the rigid panel 614, the printed circuit board 604, and the foam.

The air duct 606 may be incorporated into the electronic device 602 by mounting the planar printed circuit board 604 in the housing 630. A fan bank, typically including one or more fans 610, is mounted in the housing 630 adjacent the printed circuit board 604. At least one integrated circuit is also mounted in the housing 630 in contact or association with at least one heat sink 612. The rigid panel 614 is positioned adjacent the printed circuit board 604 and spans the space between the fan bank and the heat sinks 612.

The rigid panel 614 and conformal foam, in combination, are compressed against the printed circuit board 604 so that the conformal foam precisely seals the rigid panel 614 to protuberances, gaps, ridges, and crenellations formed by components 628 mounted on the printed circuit board 604.

The conformal foam is used in a particular implementation or application using a material selected for various characteristics including compliance, density, non-conductivity, non-porosity, and non-flammability.

The evolution to high-power processors has increased the importance of efficient cooling in electronic devices. The illustrative cooling apparatus 600 improves cooling efficiency by creating an essentially airtight airflow channel 608 from the system fans 610 to heat sinks 612 configured to cool associated processors. The essentially airtight character of the duct 606 prevents or avoids nearly all leakage, creating a nominally airtight barrier that allows only incidental leakage. The cooling apparatus 600 addresses high-power processors and components, and increased severity of cooling requirements by eliminating or reducing air leakage, increasing fan performance and avoiding bypass that leaks cooling airflow away from the heat-generating components.

The cooling apparatus 600 attains the improved performance at least partly through usage of conformal foam to avoid air leakage.

In addition to avoidance of air leakage, the conformal foam has springiness or resilience that holds the duct 606 in place by compression, in some implementations enabling the duct 606 to be secured without usage of hardware fasteners that increase expense and consume space in systems where compactness is highly desirable.

The conformal foam 626 also cushions the contact between the air duct 606 and components attached to the printed circuit board 604. The conformal foam 626 thus rigidly holds the panel 614 to the printed circuit board 604 while damping vibration and motion, thereby preventing damage to the components. In a conventional duct arrangement that does not use conformal foam, rigid panels in close proximity to circuit board components may occasionally collide with the components during system motion or vibration, possibly resulting in damage to the components. In the illustrative embodiment, one or more seals 632 coupled to either or both the input end and the output end of the 614. In some arrangements, the seals 632 are formed in a configuration that is conformal to structures abutting the panel 614, enabling formation of an airtight seal with the abutting structures, for example system fans 610 as shown.

While the present disclosure describes various embodiments, these embodiments are to be understood as illustrative and do not limit the claim scope. Many variations, modifications, additions and improvements of the described embodiments are possible. For example, those having ordinary skill in the art will readily implement the steps necessary to provide the structures and methods disclosed herein, and will understand that the process parameters, materials, and dimensions are given by way of example only. The parameters, materials, and dimensions can be varied to achieve the desired structure as well as modifications, which are within the scope of the claims. Variations and modifications of the embodiments disclosed herein may also be made while remaining within the scope of the following claims. For example, air ducts are shown with particular shapes, sizes, and configuration. The illustrative structures may be modified to any suitable shape, size and configuration. A few specific examples of electronic device structures, fan structures, heat sink configurations, fan arrangements, and fan number are depicted. Any suitable arrangement of configuration of fans and heat sinks may be implemented. The illustrative active heat sinks may be used in any appropriate electronic system or device, such as suitable servers, computers, consumer electronics devices, communication systems and devices, storage system, and others.

In the claims, unless otherwise indicated the article "a" is to refer to "one or more than one."

What is claimed is:

1. A cooling apparatus adapted to cool an electronic system using a fan, the cooling apparatus comprising:
   a rigid panel configured with a frontal view cross-section including a raised interior portion and lateral sides that terminate in lines intersecting a common plane, the raised interior portion forming an air-guiding channel adapted to receive air from an input opening at an input end of the rigid panel and guide the air to an output opening at an output end of the rigid panel opposing the input end; and
   an airtight conformal foam attached to the rigid panel lateral sides and extending beyond the rigid panel terminating lines whereby the rigid panel and conformal foam are adapted for compression against a printed circuit board, the rigid panel, the printed circuit board, and the conformal foam forming an airtight enclosure containing the air-guiding channel.

2. The apparatus according to claim 1 further comprising:
   the airtight conformal foam adapted to precisely seal the rigid panel to protuberances, gaps, ridges, and crenellations formed by components, devices, and/or elements mounted on the printed circuit board.

3. The apparatus according to claim 1 further comprising:
   the rigid panel constructed from a material selected from among a group consisting of metal, sheet metal, plastic, label stock material, printed circuit board material, ribbon cable material, wide interconnect cable materials, and liquid crystal display screen material.

4. The apparatus according to claim 1 further comprising:
   the airtight conformal foam constructed from an application-specific material selected for compliance, density, non-conductivity, non-porosity, and non-flammability.

5. The apparatus according to claim 1 further comprising:
   at least one seal coupled to the rigid panel input end and/or output end in a configuration that is conformal to structures abutting the rigid panel and adapted to form an airtight seal with the abutting structures.

6. The apparatus according to claim 1 further comprising:
   the airtight conformal foam selected with sufficient resilience and the rigid panel configured for compression against the printed circuit board by fastening a cover to a housing containing the apparatus whereby the rigid panel is secured in place against the printed circuit board in absence of hardware fasteners.

7. The apparatus according to claim 6 further comprising:
   the housing adapted to contain the rigid panel and the printed circuit board; and
   the cover integral with the rigid panel.

8. An electronic device comprising:
   a housing;
   a printed circuit board mounted in the housing;
   at least one system fan mounted in the housing;
   at least one integrated circuit mounted in the housing;
   at least one heat sink coupled to the at least one integrated circuit; and
   an air duct positioned adjacent the printed circuit board, spanning space and forming an air-guiding channel from the at least one system fan to the at least one heat sink, the air-guiding channel bounded on one side by the printed circuit board and on remaining sides by the air duct that compresses against the printed circuit board in a substantially airtight seal on closure of the housing, the air duct further comprising:
   a rigid panel configured with a frontal view cross-section including a raised interior portion and lateral sides that terminate in lines intersecting a common plane, the raised interior portion forming the air-guiding channel adapted to receive air from an input opening at an input end of the rigid panel and guide the air to an output opening at an output end of the panel opposing the input end; and
   an airtight conformal foam attached to the rigid panel lateral sides and extending beyond the rigid panel terminating lines whereby the rigid panel and conformal foam are adapted for compression against the printed circuit board, the rigid panel, the printed circuit board, and the foam forming an airtight enclosure containing the air-guiding channel.

9. The electronic device according to claim 8 further comprising:

the airtight conformal foam adapted to precisely seal the rigid panel to protuberances, gaps, ridges, and crenellations formed by components mounted on the printed circuit board.

10. The electronic device according to claim 8 further comprising:
the rigid panel constructed from a material selected from among a group consisting of metal, sheet metal, plastic, label stock material, printed circuit board material, ribbon cable material, wide interconnect cable materials, and liquid crystal display screen material.

11. The electronic device according to claim 8 further comprising:
the airtight conformal foam constructed from an application-specific material selected for compliance, density, non-conductivity, non-porosity, and non-flammability.

12. The electronic device according to claim 8 further comprising:
at least one seal element coupled to the rigid panel input end and/or output end in a configuration that is conformal to the at least one system fan and the at least one heat sink abutting the rigid panel and adapted to form an airtight seal with the abutting fans and or heat sinks.

13. The electronic device according to claim 8 further comprising:
the airtight conformal foam selected with sufficient resilience and the rigid panel configured for compression against the printed circuit board by fastening a cover to a housing whereby the rigid panel is secured in place against the printed circuit board in absence of hardware fasteners.

14. The electronic device according to claim 13 further comprising:
the cover integral with the rigid panel.

15. A method of constructing a cooling apparatus for an electronic system comprising:
forming a rigid panel configured with a frontal view cross-section including a raised interior portion and lateral sides that terminate in lines intersecting a common plane;
attaching an airtight conformal foam to the rigid panel lateral sides extending beyond the rigid panel terminating lines;
compressing the rigid panel and conformal foam against a printed circuit board; and
forming an airtight enclosure containing the air-guiding channel within the rigid panel, the printed circuit board, and the conformal foam.

16. The method according to claim 15 further comprising:
mounting a planar printed circuit board in a housing;
mounting at least one fan in the housing adjacent the printed circuit board;
mounting at least one integrated circuit in the housing;
mounting at least one heat sink in the housing in contact with the at least one integrated circuit; and
positioning the rigid panel adjacent the printed circuit board spanning space between the at least one fan and the at least one heat sink.

17. The method according to claim 15 further comprising:
compressing the rigid panel and attached conformal foam against the printed circuit board whereby the conformal foam precisely seals the rigid panel to protuberances, gaps, ridges, and crenellations formed by components mounted on the printed circuit board.

18. The method according to claim 15 further comprising:
selecting an application-specific material for compliance, density, non-conductivity, non-porosity, and non-flammability for usage as the airtight conformal foam.

19. A cooling apparatus comprising:
a printed circuit board; and
an air duct positioned adjacent the printed circuit board spanning space and forming an air-guiding channel from at least one system fan to at least one heat sink, the air-guiding channel bounded on one side by the printed circuit board and on remaining sides by the air duct comprising an airtight conformal foam that compresses against the printed circuit board in a substantially airtight seal and conforms to precisely seal to protuberances, gaps, ridges, and crenellations formed by components mounted on the printed circuit board.

* * * * *